US011688639B2

(12) United States Patent
Yu et al.

(10) Patent No.: US 11,688,639 B2
(45) Date of Patent: *Jun. 27, 2023

(54) SEMICONDUCTOR DEVICE AND METHOD

(71) Applicant: Taiwan Semiconductor Manufacturing Company, Ltd., Hsinchu (TW)

(72) Inventors: Chen-Hua Yu, Hsinchu (TW); Hung-Pin Chang, Taipei (TW); Yi-Hsiu Chen, Hsinchu (TW); Ku-Feng Yang, Baoshan Township (TW); Wen-Chih Chiou, Zhunan Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/715,854

(22) Filed: Dec. 16, 2019

(65) Prior Publication Data

US 2020/0118879 A1 Apr. 16, 2020

Related U.S. Application Data

(63) Continuation of application No. 16/225,854, filed on Dec. 19, 2018, now Pat. No. 10,510,604, which is a
(Continued)

(51) Int. Cl.
*H01L 21/78* (2006.01)
*H01L 23/00* (2006.01)
(Continued)

(52) U.S. Cl.
CPC .............. *H01L 21/78* (2013.01); *H01L 24/97* (2013.01); *H01L 21/02057* (2013.01);
(Continued)

(58) Field of Classification Search
CPC ..... H01L 21/78; H01L 24/97; H01L 2224/95; H01L 21/30608; H01L 21/02057;
(Continued)

(56) References Cited

U.S. PATENT DOCUMENTS 5,264,699 A 11/1993 Barton et al.
6,465,344 B1 10/2002 Barton
(Continued)

FOREIGN PATENT DOCUMENTS

CN 1337065 A 2/2002
CN 101339910 A 1/2009
(Continued)

OTHER PUBLICATIONS

Fukushima et al., "Non-Conductive Film and Compression Molding Technology for Self-Assembly-Based 3D integration", Conference Paper in Proceedings—Electronic Components and Technology Conference • May 2012 (Year: 2012).*
(Continued)

*Primary Examiner* — Syed I Gheyas
(74) *Attorney, Agent, or Firm* — Slater Matsil, LLP

(57) ABSTRACT

A semiconductor device and method of manufacture are provided. In an embodiment a first semiconductor device and a second semiconductor device are formed within a semiconductor wafer and a scribe region between the first semiconductor device and the second semiconductor device is patterned. A singulation process is then utilized within the scribe region to singulate the first semiconductor device from the second semiconductor device. The first semiconductor device and the second semiconductor device are then bonded to a second semiconductor substrate and thinned in order to remove extension regions from the first semiconductor device and the second semiconductor device.

20 Claims, 5 Drawing Sheets

Related U.S. Application Data continuation of application No. 14/622,420, filed on Feb. 13, 2015, now Pat. No. 10,163,709.

(51) Int. Cl.
  *H01L 21/3065* (2006.01)
  *H01L 21/306* (2006.01)
  *H01L 21/02* (2006.01)

(52) U.S. Cl.
  CPC .... *H01L 21/3065* (2013.01); *H01L 21/30604* (2013.01); *H01L 21/30608* (2013.01); *H01L 2224/95* (2013.01)

(58) Field of Classification Search
  CPC ........... H01L 21/30604; H01L 21/3065; H01L 24/95; H01L 24/92; H01L 24/05; H01L 2224/80895; H01L 2224/80896; H01L 2224/08145; H01L 2224/03009; H01L 2224/0362; H01L 2224/03845; H01L 2224/05684; H01L 2224/05647; H01L 2224/05624; H01L 25/0657; H01L 25/50; H01L 24/94; H01L 24/80; H01L 24/08
  See application file for complete search history.

(56) References Cited

U.S. PATENT DOCUMENTS

| | | | |
|---|---|---|---|
| 6,607,970 | B1 | 8/2003 | Wakabayashi |
| 6,717,245 | B1 | 4/2004 | Kinsman et al. |
| 6,777,267 | B2 | 8/2004 | Ruby et al. |
| 6,890,836 | B2 | 5/2005 | Howard et al. |
| 7,564,115 | B2 | 7/2009 | Chen et al. |
| 7,566,634 | B2 | 7/2009 | Beyne et al. |
| 7,633,165 | B2 | 12/2009 | Hsu et al. |
| 7,825,024 | B2 | 11/2010 | Lin et al. |
| 7,838,424 | B2 | 11/2010 | Karta et al. |
| 7,973,413 | B2 | 7/2011 | Kuo et al. |
| 8,105,875 | B1 | 1/2012 | Hu et al. |
| 8,158,456 | B2 | 4/2012 | Chen et al. |
| 8,183,578 | B2 | 5/2012 | Wang |
| 8,183,579 | B2 | 5/2012 | Wang |
| 8,227,902 | B2 | 7/2012 | Kuo |
| 8,278,152 | B2 | 10/2012 | Liu et al. |
| 8,384,231 | B2 | 2/2013 | Grivna et al. |
| 8,426,961 | B2 | 4/2013 | Shih et al. |
| 8,507,363 | B2 | 8/2013 | Lei et al. |
| 8,637,967 | B2 | 1/2014 | Menath et al. |
| 8,669,174 | B2 | 3/2014 | Wu et al. |
| 8,802,504 | B1 | 8/2014 | Hou et al. |
| 8,803,292 | B2 | 8/2014 | Chen et al. |
| 8,803,316 | B2 | 8/2014 | Lin et al. |
| 8,845,854 | B2 | 9/2014 | Lei et al. |
| 9,330,977 | B1 | 5/2016 | Lei et al. |
| 9,466,532 | B2 * | 10/2016 | Chu ................... H01L 21/76898 |
| 10,163,709 | B2 * | 12/2018 | Yu ....................... H01L 25/0657 |
| 10,510,604 | B2 * | 12/2019 | Yu ........................... H01L 24/08 |
| 2003/0121511 | A1 | 7/2003 | Hashimura et al. |
| 2005/0164429 | A1 | 7/2005 | Kinsman et al. |
| 2005/0266661 | A1 | 12/2005 | Li et al. |
| 2007/0173032 | A1 | 7/2007 | Gibson et al. |
| 2007/0287363 | A1 * | 12/2007 | Lange ..................... B24B 7/228 451/41 |
| 2009/0102038 | A1 | 4/2009 | McElrea et al. |
| 2011/0175242 | A1 * | 7/2011 | Grivna ................ H01L 25/0655 257/787 |
| 2013/0045570 | A1 | 2/2013 | Schuegraf et al. |
| 2013/0093094 | A1 | 4/2013 | Sung et al. |
| 2013/0249079 | A1 * | 9/2013 | Lee ..................... H01L 29/0657 257/737 |
| 2013/0337633 | A1 | 12/2013 | Seddon |
| 2014/0001645 | A1 | 1/2014 | Lin et al. |
| 2014/0213042 | A1 | 7/2014 | Lei et al. |
| 2014/0225258 | A1 | 8/2014 | Chiu et al. |
| 2014/0252572 | A1 | 9/2014 | Hou et al. |
| 2015/0069576 | A1 | 3/2015 | Mariani et al. |
| 2016/0079209 | A1 * | 3/2016 | Miyajima ............... H01L 24/94 257/770 |
| 2016/0225944 | A1 * | 8/2016 | Nishimura .......... H01L 33/0095 |

FOREIGN PATENT DOCUMENTS

| | | |
|---|---|---|
| CN | 102130022 A | 7/2011 |
| CN | 102468156 A | 5/2012 |
| CN | 103370780 A | 10/2013 |
| DE | 102011055224 A1 | 5/2012 |
| JP | S6214440 A | 1/1987 |
| JP | 2005243947 A | 9/2005 |
| JP | 2008103433 A | 5/2008 |
| JP | 2011124277 A | 6/2011 |
| JP | 2012186309 A | 9/2012 |
| KR | 20070074937 A | 7/2007 |

OTHER PUBLICATIONS

Enquist, Paul, Scalability and Low Cost of Ownership Advantages of Direct Bond Interconnect (DBI®) as Drivers for Volume Commercialization of 3-D Integration Architectures and Applications, 2008 MRS Fall Meeting, Symposium E, Jan. 22, 2009, 10 Pages.

* cited by examiner

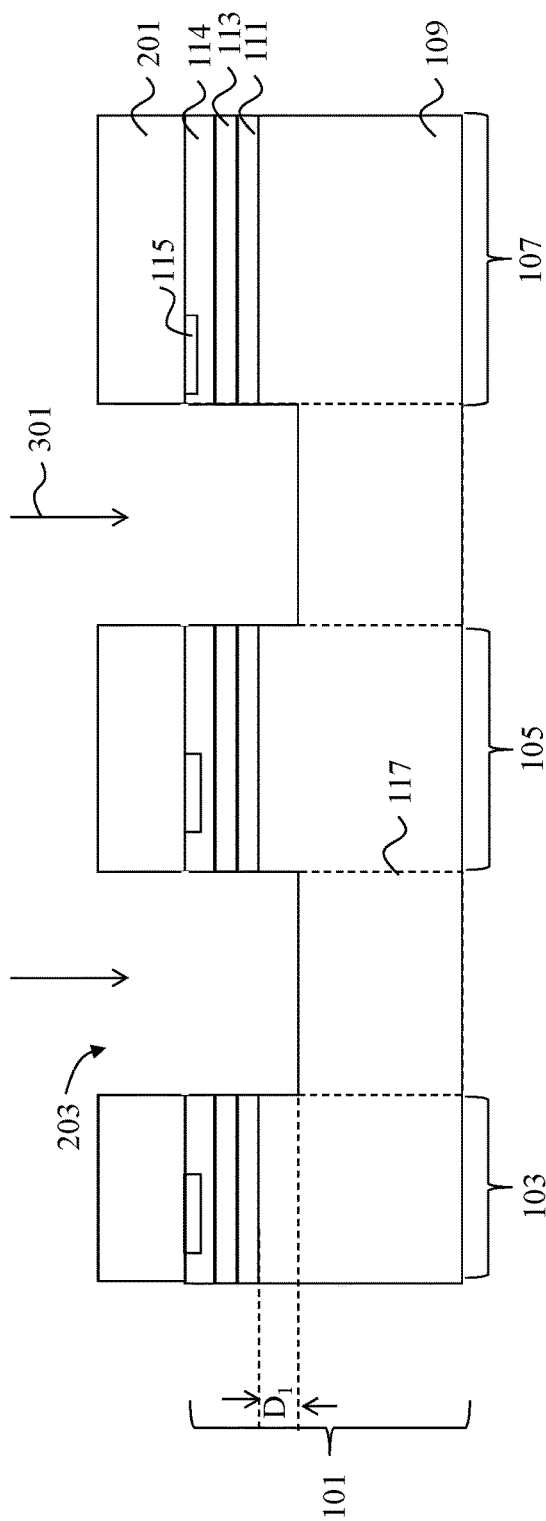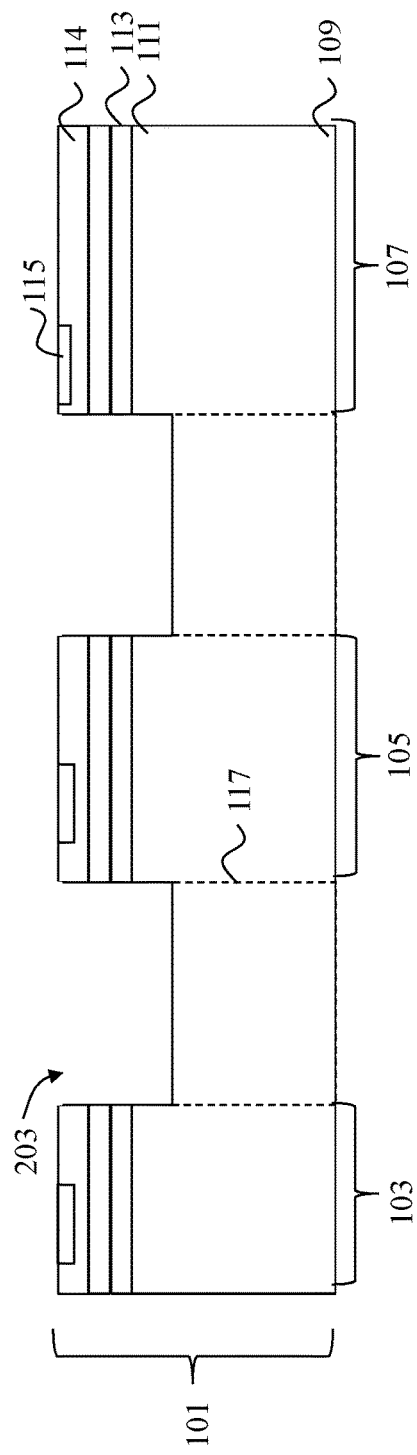

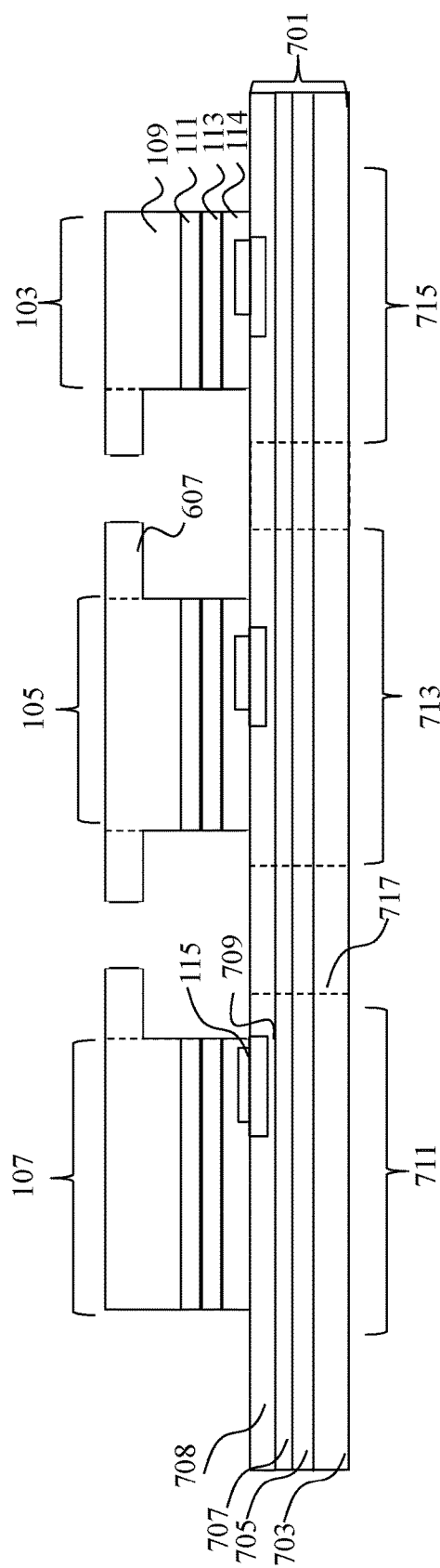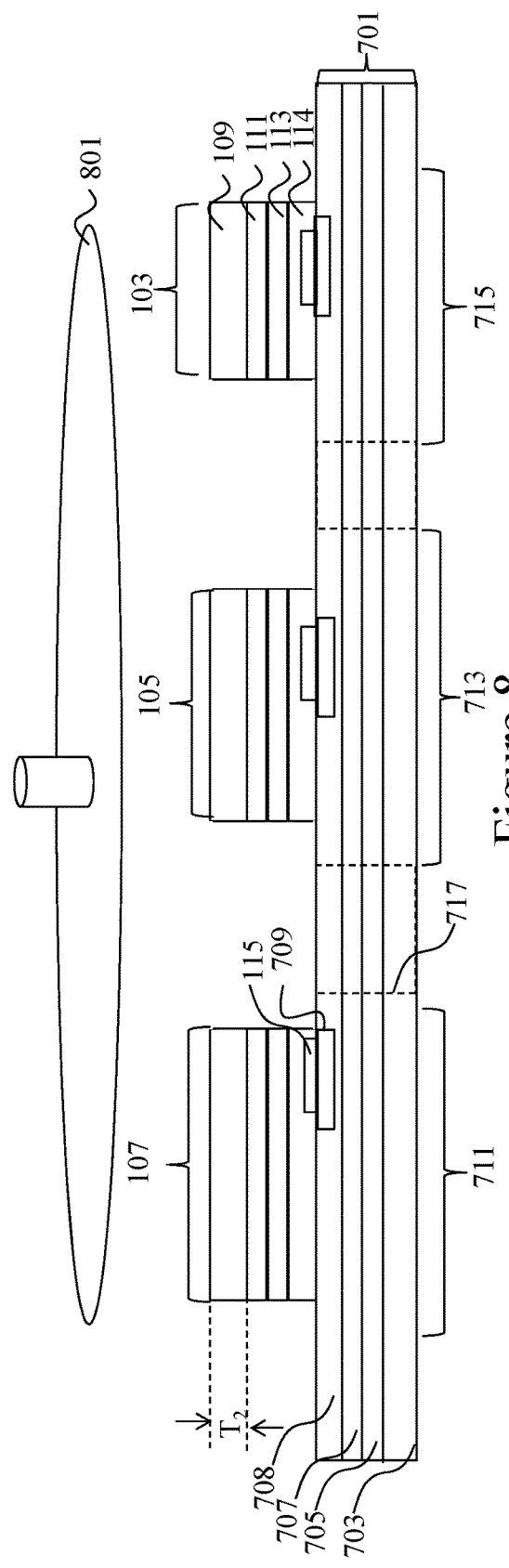

SEMICONDUCTOR DEVICE AND METHOD

PRIORITY CLAIM AND CROSS-REFERENCE

This application is a continuation of U.S. application Ser. No. 16/225,854, filed Dec. 19, 2018, which application is a continuation of U.S. application Ser. No. 14/622,420, filed Feb. 13, 2015, now U.S. Pat. No. 10,163,709, issued on Dec. 25, 2018, which applications are hereby incorporated herein by reference.

BACKGROUND

Semiconductor devices are generally manufactured by utilizing a semiconductor substrate and manufacturing devices either within or on top of the semiconductor substrate. Once these devices are manufactured, the individual devices are electrically connected by manufacturing one or more metallization layers over the individual devices and over the semiconductor substrate. These one or more metallization layers may comprise conductive layers separated by dielectric layers that connect the individual devices not only to each other but also to external devices.

However, the individual semiconductor dies are not manufactured individually. Rather, multiple semiconductor dies are formed on a single semiconductor wafer. Once the dies have been formed, the semiconductor wafer is singulated such that the individual dies are separated from each other and may be utilized separately.

Unfortunately, the process of singulation is fraught with potential hazards that can have disastrous consequences. Physical and thermal stresses that may be involved in the separation of the individual dies can damage the individual dies as they are being separated, rendering them defective and, in a worst case, inoperable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a patterning of the semiconductor substrate through the photoresist, in accordance with some embodiments.

FIGS. 4A-4B illustrate a removal of the photoresist, in accordance with some embodiments.

FIG. 7 illustrates a bonding of the first semiconductor device, the second semiconductor device, and the third semiconductor device to a semiconductor wafer, in accordance with some embodiments.

FIG. 8 illustrates a thinning of the first semiconductor device, the second semiconductor device, and the third semiconductor device, in accordance with some embodiments.

DETAILED DESCRIPTION

Figure 1:
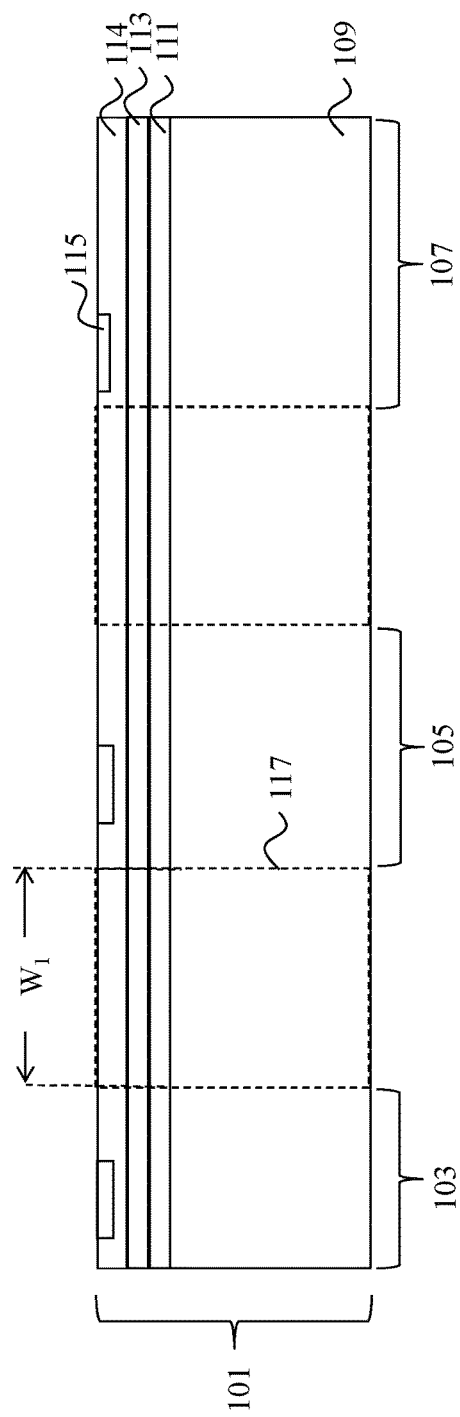
FIG. 1 illustrates a first semiconductor device, a second semiconductor device, and a third semiconductor device within and on a semiconductor substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a first wafer 101 with a first semiconductor device chip 103, a second semiconductor device chip 105, and a third semiconductor device chip 107 formed within the first wafer 101. In an embodiment the first wafer 101 comprises a first substrate 109, a first active device layer 111, first metallization layers 113, a first passivation layer 114, and first contact pads 115. The first substrate 109 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, glass substrates, ceramic substrates, or hybrid orientation substrates.

The first active device layer 111 may comprise a wide variety of active devices and passive devices such as transistors, capacitors, resistors, inductors and the like that may be used to generate the desired structural and functional desires of the design for the first wafer 101. The active devices within the first wafer 101 may be formed using any suitable methods either within or else on the first substrate 109.

The first metallization layers 113 are formed over the first substrate 109 and the active devices within the first active device layer 111 and may be used to interconnect, e.g., the active devices within the first active device layer 111. In an embodiment the first metallization layers 113 are formed of alternating layers of dielectric and conductive material and may be formed through any suitable process (such as deposition, damascene, dual damascene, etc.). In an embodiment there may be four layers of metallization, but the precise number of layers of dielectric and conductive material is dependent upon the design of the first semiconductor device chip 103, the second semiconductor device chip 105, and the third semiconductor device chip 107.

The first passivation layer 114 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first passivation layer 114 may be formed through a process such as chemical vapor deposition (CVD), although any suitable process may be utilized, and may have a thickness between about 0.5 μm and about 5 μm, such as about 9.25 KÅ.

The first contact pads 115 may be formed over and in electrical contact with the first metallization layers 113 in order to provide external connections for the first semiconductor device chip 103, the second semiconductor device chip 105, and the third semiconductor device chip 107. The first contact pads 115 are formed of a conductive material such as aluminum, although other suitable materials, such as copper, tungsten, or the like, may alternatively be utilized. The first contact pads 115 may be formed using a process such as CVD, although other suitable materials and methods may alternatively be utilized. Once the material for the first contact pads 115 has been deposited, the material may be shaped into the first contact pads 115 using, e.g., a photolithographic masking and etching process.

In an embodiment the first semiconductor device chip 103, the second semiconductor device chip 105, and the third semiconductor device chip 107 are formed within the first wafer 101 and are separated by scribe regions (represented in FIG. 1 by the dashed lines labeled 117) along which the first wafer 101 will be separated to form the individual first semiconductor device chip 103, the second semiconductor device chip 105, and the third semiconductor device chip 107. The scribe regions 117 are formed by not placing functional structures (such as active devices) into the area intended for the scribe regions 117. Other structures, such as test pads or dummy metals used for planarization, could be placed into the scribe regions 117, but would not be necessary for the functioning of the first semiconductor device chip 103, the second semiconductor device chip 105, and the third semiconductor device chip 107 once the first semiconductor device 103, the second semiconductor device chip 105, and the third semiconductor device 107 have been separated from each other. The scribe regions 117 may be formed to have a first width $W_1$ of between about 10 μm and about 200 μm, such as about 80 μm.

Figure 2:
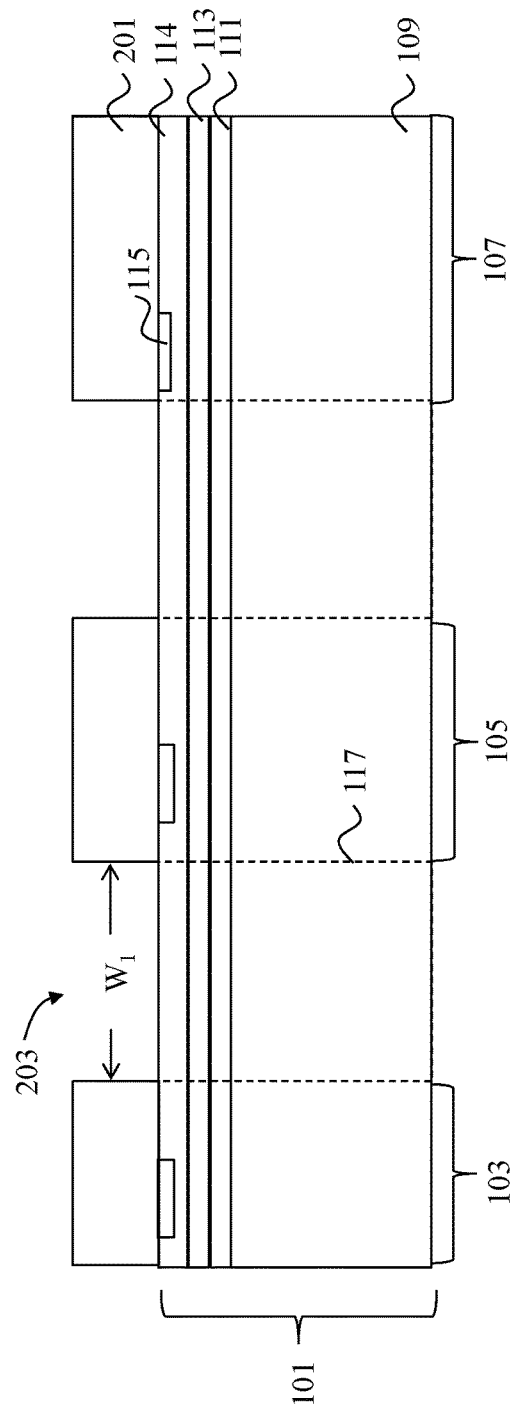
FIG. 2 illustrates a placement of a photoresist over the semiconductor substrate, in accordance with some embodiments.

FIG. 2 illustrates a placement of a photoresist 201 over the first semiconductor device chip 103, the second semiconductor device chip 105, and the third semiconductor device chip 107. In an embodiment the photoresist 201 is a photosensitive material and may be placed on the first semiconductor device chip 103, the second semiconductor device chip 105, and the third semiconductor device chip 107 using, e.g., a spin coating technique to a height of between about 0.5 μm and about 15 μm, such as about 5 μm. Once in place, the photoresist 201 may then be patterned by exposing the photoresist 201 to a patterned energy source (e.g., a patterned light source) so as to induce a chemical reaction, thereby inducing a physical change in those portions of the photoresist 201 exposed to the patterned light source. A developer is then applied to the exposed photoresist 201 to take advantage of the physical changes and selectively remove either the exposed portion of the photoresist 201 or the unexposed portion of the photoresist 201, depending upon the desired pattern.

In an embodiment the photoresist 201 is patterned to form first openings 203 which expose the scribe regions 117. As such, the first openings 203 may be formed to have the first width $W_1$ of the scribe regions 117, such as by being between about 10 μm and about 150 μm, such as about 80 μm. However, any other suitable width may alternatively be utilized.

FIG. 3 illustrates that, once the photoresist 201 has been placed and patterned over the first semiconductor device chip 103, the second semiconductor device chip 105, and the third semiconductor device chip 107, a first etching process (represented in FIG. 3 by the arrows labeled 301) may be performed in order to extend the first openings 203 through the first passivation layer 114, the first metallization layers 113, the first active device layer 111, and into the first substrate 109. In an embodiment the first etching process may be, e.g., one or more reactive ion etching processes which utilize one or more etchants to directionally etch through the first metallization layers 113, the first active device layer 111, and into the first substrate 109.

As such, while the precise etchants and process conditions utilized will be at least in part dependent upon the materials chosen for each layer, in an embodiment in which the first substrate 109 is silicon, the first etching process 301, when etching the first substrate 109, may utilize an etchant such as F-chemicals or $O_2$, along with, optionally, a carrier gas such as argon, although any suitable etchant may alternatively be utilized.

Additionally, an RF power for the reactive ion etching may be set to be between about 100 W and about 4000 W, such as about 2500 W and the bias power may be set to be between about 10 V and about 500 V, such as about 200 V. Finally, the pressure of the etching chamber may be set to be between about 10 mTorr and about 200 mTorr, such as about 90 mTorr, and the temperature of the process may be controlled to be between about −20° C. and about 50° C., such as about 0° C. However, these conditions are intended to be illustrative, as any suitable etching conditions may alternatively be utilized, and all such process conditions are fully intended to be included within the scope of the embodiments.

In an embodiment the first etching process 301 may be utilized to extend the first openings 203 at least partially into the first substrate 109. For example, the first etching process 301 may be utilized to extend the first openings 203 a first depth $D_1$ into the first substrate 109 of between about 5 μm and about 100 μm, such as about 30 μm. However, any other suitable depth may alternatively be utilized.

However, while the dry etch process described above may be utilized in order to pattern the first substrate 109, this description is intended to be illustrative only and is not intended to be limiting to the embodiments. For example, a wet etch process which may form curved sidewalls in which the first wafer 101 is immersed within a liquid etchant such as a HF-based solution or TMAH at a temperature of between about room temperature and about 80° C. for a time period of between about 1 minute and about 30 minutes, may alternatively be used. Any suitable method of patterning the first substrate 109 may be used, and all are fully intended to be included within the scope of the embodiments.

FIG. 4A illustrates a removal of the photoresist 201 and a post removal cleaning process. In an embodiment the photoresist 201 may be removed utilizing, e.g., an ashing process, whereby a temperature of the photoresist 201 is raised until the photoresist 201 experiences a thermal decomposition and may be easily removed. However, any other suitable removal process may alternatively be utilized.

Once the ashing has been performed, the structure may be cleaned using a first cleaning process in order to help assist in the removal of the photoresist 201. In an embodiment the first cleaning process may include dipping the first semiconductor device chip 103, the second semiconductor device chip 105, and the third semiconductor device chip 107 into an etchant in order to ensure that any remaining portions of the photoresist 201 are removed from the first semiconductor device chip 103, the second semiconductor device chip 105, and the third semiconductor device chip 107 prior to subsequent processing. For example, the first semiconductor device chip 103, the second semiconductor device chip 105, and the third semiconductor device chip 107 may be dipped into an etchant such as HF for between about 1 second and about 100 seconds, such as about 60 seconds.

Figure 4B:
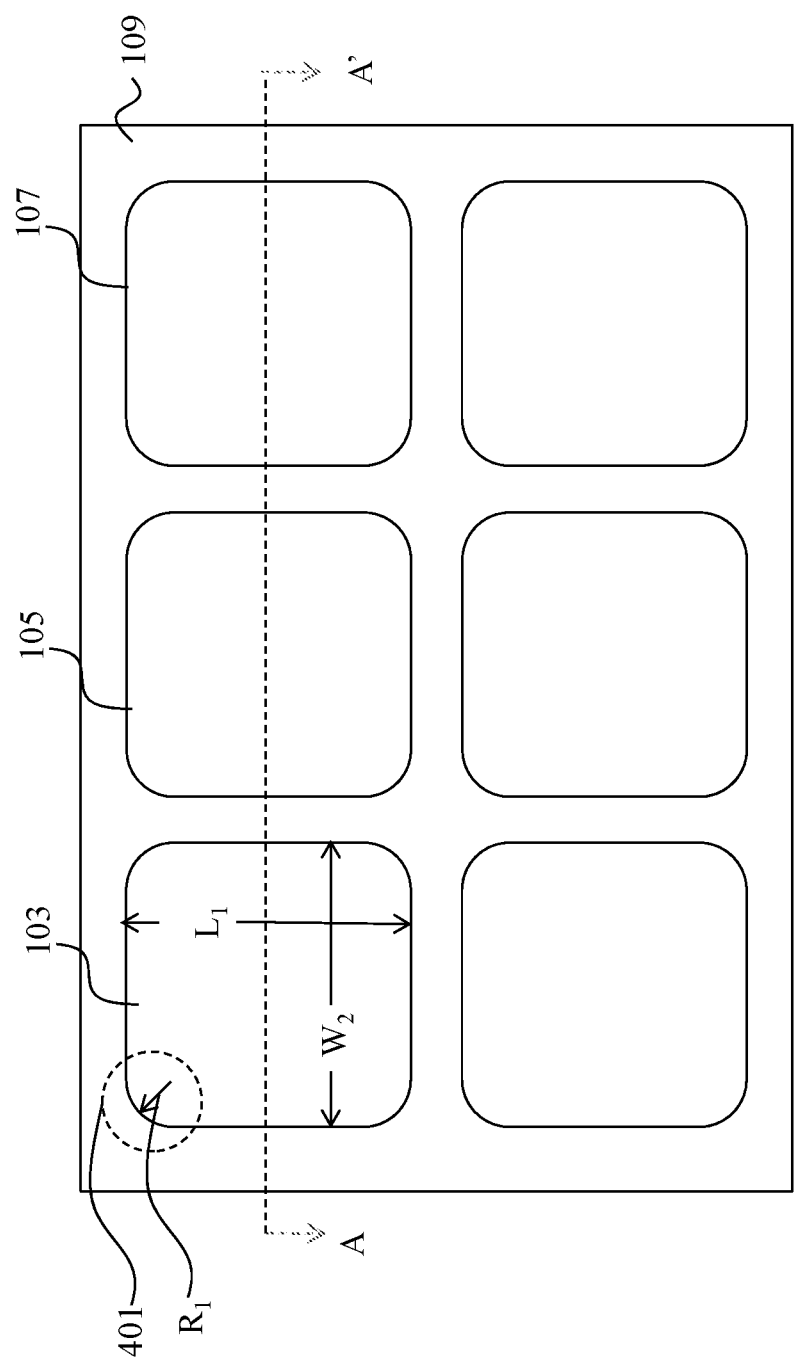

FIG. 4B illustrates a top down view of the embodiment illustrated in FIG. 4A. In this embodiment the scribe regions 117 are illustrated between the first semiconductor device chip 103, the second semiconductor device chip 105, and the third semiconductor device chip 107. However, as can be seen in this top-down view, the first etching process 301 (described above with respect to FIG. 3) may be utilized to form rounded corners (represented in FIG. 4B by the dashed circle labeled 401) for each of the first semiconductor device chip 103, the second semiconductor device chip 105, and the third semiconductor device chip 107. In a particular embodiment in which the first semiconductor device chip 103 may have a second width $W_2$ of between about 1 mm and about 30 mm, such as about 4 mm, and a first length $L_1$ of between about 1 mm and about 30 mm, such as about 4 mm, the curved corner may have an arc radius $R_1$ of between about 50 μm and about 500 μm, such as about 250 μm. However, any suitable arc radius may alternatively be utilized.

By using the first etching process 301 to form the rounded corners 401 at the corners of the first semiconductor device chip 103, the second semiconductor device chip 105, and the third semiconductor device chip 107, the first semiconductor device chip 103, the second semiconductor device chip 105, and the third semiconductor device chip 107 are better able to withstand the stresses involved during the singulation process (described further below with respect to FIG. 6). In particular, the rounded corners 401 can distribute and withstand the stresses of a saw blade physically cutting and separating the first semiconductor device chip 103, the second semiconductor device chip 105, and the third semiconductor device chip 107. As such, fewer defects will occur during the singulation process.

Figure 5:
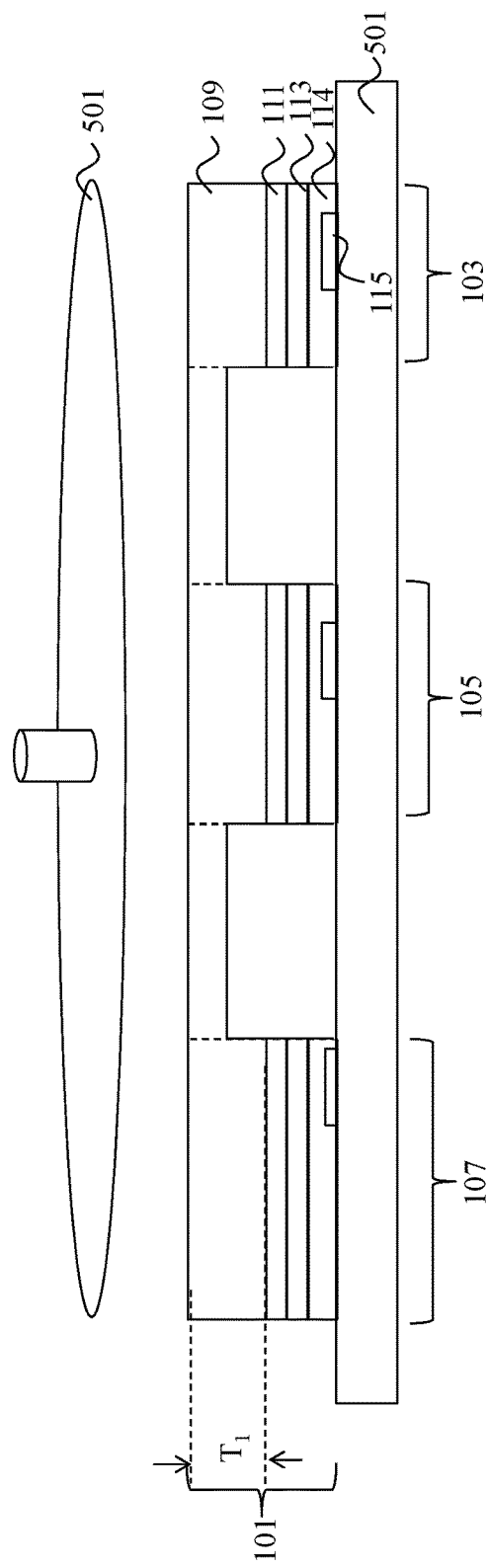
FIG. 5 illustrates a placement of a protective layer, in accordance with some embodiments.

FIG. 5 illustrates a placement of a protective film 501 over the first semiconductor device chip 103, the second semiconductor device chip 105, and the third semiconductor device chip 107 and a thinning of the backside of the first substrate 109. In an embodiment the protective film 501 may be a backgrinding tape (BG tape), which may be used to protect the patterned side of the first substrate 109 from grinding debris during the thinning of the first substrate 109. The protective film 501 may be applied over the first openings 203 using, for example, a roller (not separately illustrated in FIG. 5).

However, while the protective film 501 is described above as a BG tape, this is intended to be illustrative and is not intended to limit the embodiments. Rather, any suitable method of protecting the patterned surface of the first semiconductor device chip 103, the second semiconductor device chip 105, and the third semiconductor device chip 107, including the first openings 203, may alternatively be utilized. All such protective layers are fully intended to be included within the scope of the embodiments.

Once the first openings 203 have been protected, the first substrate 109 is thinned utilizing, e.g., a first thinning process (represented in FIG. 5 by the rotating platen labeled 501). In an embodiment the first wafer 101 may be thinned using, e.g., chemical mechanical polishing, whereby a combination of chemical reactants and abrasives are utilized with one or more grinding pads in order to remove portions of the first substrate 109 opposite the first contact pads 115. However, any other suitable process, such as a physical grinding process, one or more etching processes, combinations of these, or the like, may alternatively be utilized. In an embodiment the first wafer 101 is thinned to have a first thickness $T_1$ after the thinning of between about 100 μm and about 500 μm, such as about 200 μm.

Figure 6:
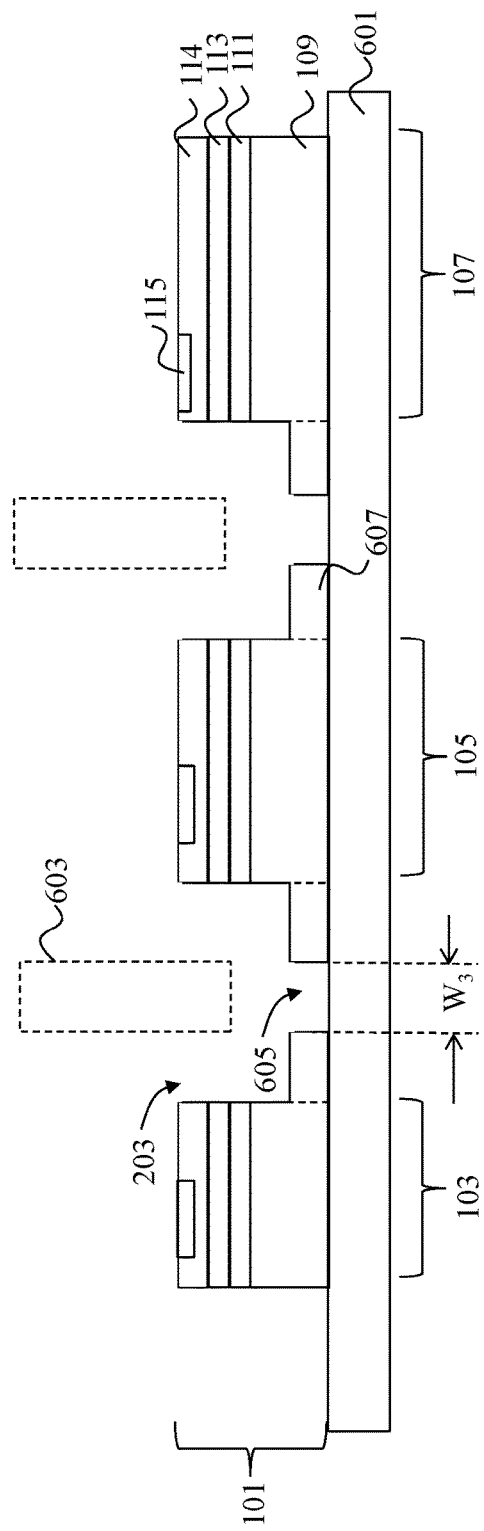
FIG. 6 illustrates a singulation of the semiconductor substrate, in accordance with some embodiments.

FIG. 6 illustrates a singulation of the first wafer 101 into the first semiconductor device chip 103, the second semiconductor device chip 105, and the third semiconductor device chip 107. In an embodiment the protective film 501 is initially removed and the first wafer 101 is attached to a support substrate 601 prior to the singulation. The support substrate 601 may be, for example, a tape such as the commonly known blue tape, and works as a means to control the placement of the first wafer 101. As such, while the support substrate 601 is referred to herein as a tape, the support substrate 601 is not limited to tape, and may be any other medium, such as a carrier wafer, a carrier glass, a metal plate, or a ceramic plate, that provides for the placement of the first wafer 101 as desired.

Once attached to the support substrate 601, the singulation may be performed by using a saw blade (represented in FIG. 6 by the dashed box labeled 603) to slice through the scribe regions 117 to form second openings 605 through the first substrate 109 between the first semiconductor device chip 103, and the second semiconductor device chip 105, and between the second semiconductor device chip 105 and the third semiconductor device chip 107.

In an embodiment the saw blade 603 is utilized to slice the first substrate 109 between the first semiconductor device chip 103 and the second semiconductor device chip 105, and between the second semiconductor device chip 105 and the third semiconductor device chip 107 without removing additional material from the sidewalls of the first openings 203. As such, the second openings 605 may be formed to have a third width $W_3$ that is less than the first width $W_1$, such as by being between about 10 μm and about 300 μm, such as about 50 μm. However, any suitable dimension may be used for the third width $W_3$. Because of this, first substrate extensions 607 are left on the first semiconductor device chip 103, the second semiconductor device chip 105, and the third semiconductor device chip 107.

Additionally, as one of ordinary skill in the art will recognize, utilizing a saw blade to singulate the first wafer 101 is merely one illustrative embodiment and is not intended to be limiting. Alternative methods for singulating the first wafer 101, such as utilizing one or more etches to separate the first semiconductor device chip 103, the second semiconductor device chip 105, and the third semiconductor device chip 107, may alternatively be utilized. These methods and any other suitable methods may alternatively be utilized to singulate the first wafer 101.

FIG. 7 illustrates a bonding of the first semiconductor device chip 103, the second semiconductor device chip 105, and the third semiconductor device chip 107 to a second wafer 701 in a chip on wafer (CoW) bonding configuration. The second wafer 701 may comprise a second substrate 703, a second active device layer 705, second metallization layers 707, second passivation layer 708, and second contact pads 709, which may be similar to the first substrate 109, the first active device layer 111, the first metallization layers 113, the first passivation layer 114, and the first contact pads 115, respectively. The second substrate 703, the second active device layer 705, the second metallization layers 707, the second passivation layer 708, and the second contact pads 709 may form a fourth semiconductor device chip 711, a fifth semiconductor device chip 713, and a sixth semiconductor device chip 715 (separated by second scribe regions 717) that will be utilized to operate in conjunction with the first semiconductor device 103, the second semiconductor device 105, and the third semiconductor device 107, respectively.

The first semiconductor device chip 103 may be bonded to the second wafer 701 utilizing, e.g., a fusion bonding process. In an embodiment the fusion bonding process may be initiated by performing an initial cleaning process on the second wafer 701 where the bond is desired. In a particular embodiment the second wafer 701 may be cleaned using, e.g., a wet cleaning procedure such as an SC-1 or SC-2 cleaning procedure to form a hydrophilic surface. Once cleaned, the first semiconductor device chip 103, the second semiconductor device chip 105, and the third semiconductor device chip 107 are aligned into their respective desired positions on the second wafer 701 and the hydrophilic surface is placed into physical contact with the first semiconductor device chip 103, the second semiconductor device chip 105, and the third semiconductor device chip 107 to begin the bonding procedure. Once the first semiconductor device chip 103, the second semiconductor device chip 105, and the third semiconductor device chip 107 have been contacted to the second wafer 701, a thermal anneal may be utilized to strengthen the bonds.

However, the descriptions of the fusion bonding as described above is merely an example of one type of process that may be utilized in order to bond the first semiconductor device chip 103, the second semiconductor device chip 105, and the third semiconductor device chip 107 to the second wafer 701, and is not intended to be limiting upon the embodiments. Rather, any suitable bonding process may alternatively be utilized to bond the first semiconductor device chip 103, the second semiconductor device chip 105, and the third semiconductor device chip 107 to the second wafer 701, and all such processes are fully intended to be included within the embodiments.

FIG. 8 illustrates a second thinning process (represented in FIG. 8 by the rotating platen labeled 801) that is utilized to remove the first substrate extensions 607 from the first semiconductor device chip 103, the second semiconductor device chip 105, and the third semiconductor device chip 107 after the first semiconductor device chip 103, the second semiconductor device chip 105, and the third semiconductor device chip 107 have been bonded to the second wafer 701. In an embodiment the first semiconductor device chip 103, the second semiconductor device chip 105, and the third semiconductor device chip 107 may be thinned using, e.g., chemical mechanical polishing, whereby a combination of chemical reactants and abrasives are utilized with one or more grinding pads in order to remove portions of the first semiconductor device chip 103, the second semiconductor device chip 105, and the third semiconductor device chip 107 opposite the first contact pads 115. However, any other suitable process, such as a physical grinding process, one or more etching processes, combinations of these, or the like, may alternatively be utilized. In an embodiment the first semiconductor device chip 103, the second semiconductor device chip 105, and the third semiconductor device chip 107 are thinned to a thickness sufficient to remove the first substrate extensions 607, such as being thinned to a second thickness $T_2$ such as between about 10 μm and about 250 μm, such as about 25 μm. However, any suitable thickness may alternatively be used.

By utilizing the first etching process 301 to pattern the scribe regions 117 prior to the singulation of the first semiconductor device chip 103, the second semiconductor device chip 105, and the third semiconductor device chip 107, the stresses from the singulation process will be better relaxed, and any dicing inducing debris may be minimized. As such, a better interface may be obtained between the first semiconductor device chip 103, the second semiconductor device chip 105, and the third semiconductor device chip 107 and the second wafer 701. As such, a better die-wafer fusion bonding may be achieved, resulting in a stronger bond with fewer defects.

Once the first semiconductor device chip 103, the second semiconductor device chip 105, and the third semiconductor device chip 107 have been bonded to the second wafer 701 and thinned, additional processing may be performed on the second wafer 701. For example, the second wafer 701 may be singulated itself in order to form semiconductor devices ready to be used.

In accordance with an embodiment, a method of manufacturing a semiconductor device comprising forming a first opening in a first semiconductor wafer between a first semiconductor die and a second semiconductor die, the first opening having a first width parallel to a major surface of the semiconductor wafer is provided. The semiconductor wafer is singulated to form a second opening, wherein the first opening and the second opening separate the first semiconductor die and the second semiconductor die, the second opening having a second width parallel to the major surface of the semiconductor wafer that is smaller than the first width. The first semiconductor die is thinned until the first semiconductor die has a straight sidewall.

In accordance with another embodiment, a method of manufacturing a semiconductor device comprising forming a first semiconductor die and a second semiconductor die at least partially within a semiconductor substrate is provided. A first portion of the semiconductor substrate is removed, wherein the first portion is located within a scribe region of the semiconductor substrate. A second portion of the semiconductor substrate is removed using a saw blade, wherein the removing the first portion of the semiconductor substrate and the removing the second portion of the semiconductor substrate separate the first semiconductor die from the second semiconductor die and also forms semiconductor material extensions on the first semiconductor die.

In accordance with yet another embodiment, method of manufacturing a semiconductor device comprising forming a first opening within a first semiconductor wafer between a first semiconductor die and a second semiconductor die, wherein the forming the first opening is performed at least in part with an etching process is provided. A second opening is formed within the first semiconductor wafer between the first semiconductor die and the second semiconductor die, wherein the forming the second opening is performed at least in part with a sawing process and wherein the second opening has a smaller width than the first opening and the first opening and the second opening extend singulate the first semiconductor die from the second semiconductor die. The first semiconductor die and the second semiconductor die are bonded to a second semiconductor wafer. The first semiconductor die and the second semiconductor die are thinned after the bonding the first semiconductor die and the second semiconductor die, wherein the thinning the first semiconductor die and the second semiconductor die remove extension regions from the first semiconductor die and the second semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    partially singulating a first semiconductor device of a semiconductor wafer from a second semiconductor device of the semiconductor wafer, the semiconductor wafer comprising a first semiconductor material, the first semiconductor device being a first semiconductor die and the second semiconductor device being a second semiconductor die;
    thinning the first semiconductor material a first time and a second time different from the first time, wherein after the thinning the first semiconductor material the second time the first semiconductor device has a straight sidewall, wherein the thinning the first semiconductor material the second time reduces a thickness from between about 100 μm and 500 μm to between about 10 μm and 250 μm, wherein during the thinning the first semiconductor material the first time a cover is placed over the first semiconductor device and the second semiconductor device, the cover being removed prior to the thinning the first semiconductor material the second time, the thinning the first semiconductor material occurring after the partially singulating removes a portion of the first semiconductor material;
    sawing the first semiconductor material between the thinning the first semiconductor material the first time and the thinning the first semiconductor material the second time;
    bonding the first semiconductor device to a third semiconductor die and bonding the second semiconductor device to a fourth semiconductor die within a second semiconductor substrate, wherein the third semiconductor die and the fourth semiconductor die are part of a second semiconductor wafer during the bonding, the bonding occurring prior to the thinning the first semiconductor material the second time, wherein the first semiconductor device and the second semiconductor wafer are in a chip on wafer configuration after the bonding, the bonding the first semiconductor device to the third semiconductor die placing a contact pad of the first semiconductor die and a dielectric layer of the first semiconductor die in physical contact with the third semiconductor die, the contact pad and the dielectric layer being coplanar with each other, wherein an interface between the dielectric layer of the first semiconductor die and the third semiconductor die extends from an exposed first external sidewall of the first semiconductor die to an exposed second external sidewall of the first semiconductor die, wherein the interface has a first width during the bonding, wherein both the first external sidewall and the second external sidewall are planar from a first side of the first semiconductor die to a second side of the second semiconductor die, and wherein the first width equals a second width of the first semiconductor die and wherein the first width is smaller than a third width of a semiconductor substrate of the third semiconductor die, wherein after the bonding the dielectric layer of the first semiconductor die has a sidewall that is planar with a sidewall of the first semiconductor material of the first semiconductor die; and
    singulating the second semiconductor wafer after the bonding.

2. The method of claim 1, wherein the partially singulating the first semiconductor device forms an opening within a scribe region, the scribe region having a width of between about 10 μm and about 200 μm, and wherein the singulating the second semiconductor wafer is performed after the thinning the first semiconductor material the second time and wherein the bonding is performed after the sawing the first semiconductor material.

3. The method of claim 1, wherein the partially singulating the first semiconductor device forms a rounded corner.

4. The method of claim 3, wherein the rounded corner has an arc radius of between about 50 μm and about 250 μm.

5. The method of claim 3, wherein the rounded corner has an arc radius of between about 50 μm and about 250 μm.

6. The method of claim 1, wherein the partially singulating the first semiconductor device forms an opening into a semiconductor substrate of the semiconductor wafer to a depth of between about 5 μm and about 100 μm.

7. The method of claim 6, wherein the opening has curved sidewalls.

8. A method of manufacturing a semiconductor device, the method comprising:
    receiving a first semiconductor device adjacent to a second semiconductor device, wherein a first semiconductor material extends from within the first semiconductor device, between the first semiconductor device and the second semiconductor device, to within the second semiconductor device, the first semiconductor device comprising a first semiconductor die and the second semiconductor device comprising a second semiconductor die;
    chemical mechanical polishing the first semiconductor material to a first thickness of between about 100 μm and about 500 μm, wherein an opposite side of the first semiconductor device from the side being chemically mechanically polished is covered by a backgrinding tape during the chemical mechanical polishing, the backgrinding tape having a planar surface facing the first semiconductor material and extending from a first side of the first semiconductor device to a second side of the first semiconductor device;
    removing the backgrinding tape;
    after the removing the backgrinding tape, cutting the first semiconductor material after the chemical mechanical polishing the first semiconductor material;
    bonding the first semiconductor die to a hydrophilic surface of a third semiconductor die at least partially within a semiconductor wafer to form a chip on wafer structure, the bonding being done after the cutting the first semiconductor material;

after the bonding, chemical mechanical polishing the first semiconductor material to a second thickness of between about 10 μm and about 250 μm;

singulating the semiconductor wafer after the chemical mechanical polishing the first semiconductor material to the second thickness; and bonding the second semiconductor die to a hydrophilic surface of a fourth semiconductor die at least partially within the semiconductor wafer to form a second chip on wafer structure, the bonding being done after the cutting the first semiconductor material, the bonding the first semiconductor die and the bonding the second semiconductor die occurring prior to the chemical mechanical polishing the first semiconductor material to the second thickness, wherein after the bonding the first semiconductor die to the hydrophilic surface of the third semiconductor die a bonding interface between the hydrophilic surface of the third semiconductor die and the first semiconductor die extends to edges of the first semiconductor die but does not extend beyond a semiconductor substrate of the first semiconductor die, the bonding interface having a width less than a semiconductor substrate of the third semiconductor die, the bonding interface terminating at an exposed external sidewall of the first semiconductor die.

9. The method of claim 8, further comprising:

prior to the chemical mechanical polishing the first semiconductor material to the first thickness, patterning the first semiconductor device to have a curved corner.

10. The method of claim 9, wherein the curved corner has an arc radius of between about 50 μm and about 250 μm.

11. The method of claim 10, wherein the first semiconductor device has a first length of between about 1 mm and about 30 mm and has a first width of between 1 mm and about 30 mm.

12. The method of claim 9, wherein the patterning the first semiconductor device comprises a wet etching process.

13. The method of claim 12, wherein the wet etching process forms curved sidewalls.

14. The method of claim 8, wherein the first semiconductor material has a smaller thickness between the first semiconductor device and the second semiconductor device than within the second semiconductor device.

15. A method of manufacturing a semiconductor device, the method comprising:

manufacturing a first semiconductor device and a second semiconductor device with a semiconductor wafer, the first semiconductor device being a first semiconductor die and the second semiconductor device being a second semiconductor die;

singulating the first semiconductor device from the second semiconductor device, the semiconductor die comprising a contact pad coplanar with a passivation layer during the singulating, the singulating comprising:

a first chemical mechanical polishing process with a backgrinding tape protecting the first semiconductor device, a surface of the backgrinding tape in physical contact with contact pads being planar across the contact pads;

a second chemical mechanical polishing process, wherein the backgrinding tape is removed prior to the second chemical mechanical polishing process;

a sawing process between the first chemical mechanical polishing process and the second chemical mechanical polishing process, wherein the sawing process occurs while a semiconductor substrate of the semiconductor wafer has a thickness of between about 100 μm and about 500 μm; and contacting the contact pad and the passivation layer of the first semiconductor die to a third semiconductor die and bonding the second semiconductor die to a fourth semiconductor die, wherein the bonding forms a chip on wafer structure, the bonding occurring after the sawing process and prior to the second chemical mechanical polishing process, wherein a bonding interface between the first semiconductor die and the third semiconductor die is as wide as the first semiconductor die and smaller than a semiconductor substrate of the third semiconductor die, the bonding interface intersecting an exposed external sidewall of the first semiconductor die at a perpendicular angle.

16. The method of claim 15, wherein after the second chemical mechanical polishing process the semiconductor substrate has a thickness of between about 10 μm and about 250 μm.

17. The method of claim 15, wherein the contacting the contact pad and the passivation layer is performed at least in part with a fusion bonding process.

18. The method of claim 15, further comprising:

etching an opening into the semiconductor wafer prior to the first chemical mechanical polishing process and after the manufacturing the first semiconductor device; and singulating the third semiconductor from the fourth semiconductor die after the contacting the contact pad and the passivation layer.

19. The method of claim 18, wherein the opening has a first depth into the semiconductor wafer of between about 5 μm and about 100 μm.

20. The method of claim 18, wherein the etching the opening forms curved sidewalls.

* * * * *

UNITED STATES PATENT AND TRADEMARK OFFICE
CERTIFICATE OF CORRECTION

PATENT NO. : 11,688,639 B2
APPLICATION NO. : 16/715854
DATED : June 27, 2023
INVENTOR(S) : Yu et al.

It is certified that error appears in the above-identified patent and that said Letters Patent is hereby corrected as shown below:

In the Claims

In Column 10, in Claim 4, Line 31, delete "250 μm." and insert -- 500 μm. --, therefor.

Signed and Sealed this
Twelfth Day of September, 2023

Katherine Kelly Vidal
*Director of the United States Patent and Trademark Office*